United States Patent [19]

Cline

[11] Patent Number: 4,703,395

[45] Date of Patent: Oct. 27, 1987

[54] BREADBOARD PANEL CONSTRUCTION FOR ELECTRONIC CIRCUITRY

[75] Inventor: Thomas L. Cline, Hanover, Pa.

[73] Assignee: Corra-Board Products Co., Inc., Hanover, Pa.

[21] Appl. No.: 911,726

[22] Filed: Sep. 26, 1986

[51] Int. Cl.[4] .............................................. H05K 7/02
[52] U.S. Cl. .................................... 361/417; 428/116; 428/182; 428/901
[58] Field of Search ............... 361/346, 380, 417, 418, 361/419, 420, 405, 414, 398, 397, 399, 400; 428/901, 209, 211, 131, 137, 138, 116, 182; 174/68.5

[56] References Cited

U.S. PATENT DOCUMENTS 3,263,023  7/1966  Staley ................................. 174/68.5
3,522,474  8/1970  Piel .................................. 361/414 X
3,695,968  10/1972  Morrison ........................ 428/116 X Primary Examiner—J. R. Scott
Assistant Examiner—Morris Ginsburg
Attorney, Agent, or Firm—Daniel J. O'Connor

[57] ABSTRACT

This invention relates generally to an electronic circuit breadboard assembly having a particular novel layered construction. In place of a conventional solid chipboard laminated construction, an undulated midstratum layer is utilized in such manner that air cells or pockets are formed within the structure. An overlayer and an underlayer are adhesively applied to the undulated midstratum layer. The invention results in a breadboard assembly which may be much more economically manufactured while yielding superior end product strength and durability. The invention has widespread utility in the electronics assembly field as a superior substitute for the currently used solid laminated chipboard design.

1 Claim, 3 Drawing Figures

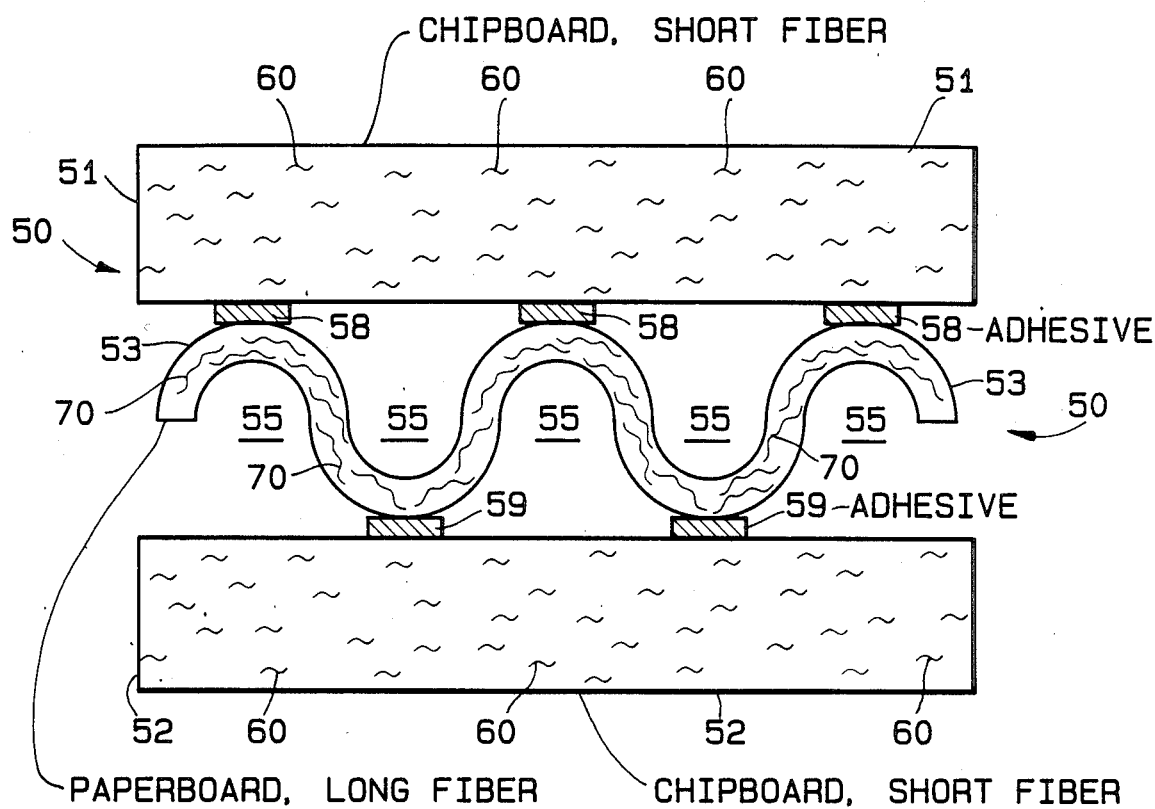
FIG. 1A
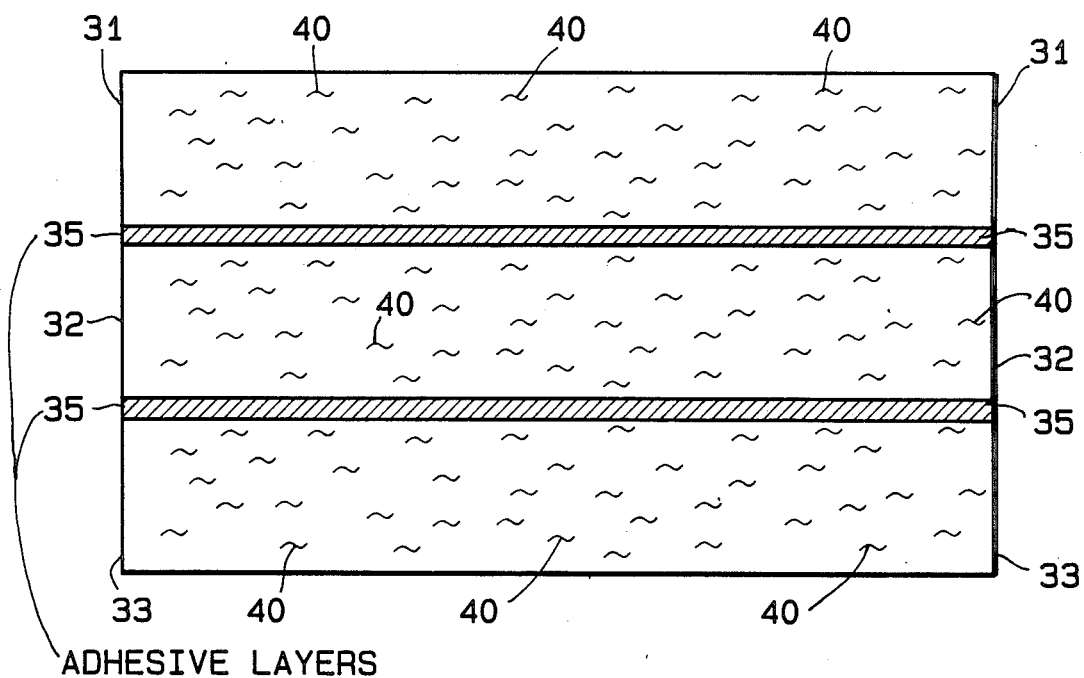
FIG. 1B - PRIOR ART

BREADBOARD PANEL CONSTRUCTION FOR ELECTRONIC CIRCUITRY

BACKGROUND AND OBJECTS OF THE INVENTION

It is known in the prior art that breadboards, i.e. flat apertured support structures for electronic circuitry, are comprised of plastics, paperboard materials or other electrically insulating materials. This invention relates to the paperboard constructions currently used in the breadboard technology.

Paperboard breadboard assemblies currently in use are formed of a multi-layered solid laminated chipboard as shown in the prior art drawing of FIG. 1B.

The laminated solid chipboard structures of the prior art typically comprise five or more layers, three of which are shown at 31, 32 and 33 of FIG. 1B. Each layer must be fully joined to an adjacent layer by adhesives 35 as is known in the art.

Chipboard is a term known to those of skill in the art to signify paper products processed from, for example, waste paper materials and thus having relatively short fiber lengths contained therein as shown at numerals 40 in the prior art showing at FIG. 1B.

Because chipboard is, by definition, formed of short fiber length materials, it inherently has low original position memory. That is, once bent, chipboard is unable to successfully return to its original desired flat position. Because of such low memory by chipboard products, it has been required to typically utilize five or more chipboard layers in the formation of paperboard panels for breadboard usage. The required usage of such a high number of chipboard layers has increased adhesives costs and manufacturing time and materials costs generally.

Accordingly, it is an object of the present invention to provide a breadboard panel structure which is less costly to manufacture and ship than the conventionally used laminated solid chipboard design.

It is a further object to reduce manufacturing costs by effectively using air cells within the breadboard panel assembly to reduce overall materials costs.

It is a still further object of the invention to significantly reduce the cost of adhesives used in the production of breadboard panels.

It is a further object to demonstrate a breadboard panel construction which can be bent without the cracking inherent in prior art designs so that electronic circuitry may be reliably attached thereon.

It is a still further object to provide a breadboard panel construction which has a higher original position memory than has been heretofore known in the art so that electronic circuitry is less subject to damage upon assembly.

It is a further significant object of the present invention to produce a breadboard panel construction having the same or increased thickness as prior art designs while decreasing panel weight and improving panel durability.

It is also an object of the invention to demonstrate an advantageous breadboard panel construction which utilizes an undulated midstratum layer having significantly longer average fiber lengths relative to an overlayer and underlayer which are formed of chipboard materials having significantly shorter average fiber lengths therein.

Further objects and advantages of the present invention will become apparent as the following description proceeds, and the features of novelty characterizing the invention will be pointed out with particularity.

PRIOR ART PATENTS

The most closely related prior art patents presently known to the inventor herein are listed as follows: U.S. Pat. No. 2,878,587 issued to Jubenville on Mar. 24, 1959; U.S. Pat. No. 2,893 137 issued to Alling on July 7, 1959; U.S. Pat. No. 3,074,181 issued to Watson on Jan. 22, 1963; U.S. Pat. No. 3,145,483 issued to Cruz on Aug. 25, 1964; and U.S. Pat. No. 3,548,261 issued to Chambers on Dec. 15, 1970.

Each of the above-cited patents illustrates the prior art usage of paperboard or hardboard support blocks for use as electric circuit modules.

However, as will be appreciated by those of skill in the art, the prior art does not show the novel layered breadboard construction as specifically set forth in the present invention.

BRIEF DESCRIPTION OF THE DRAWING FIGURES

FIG. 1A is a side schematic view illustrating the construction details of the present invention.

FIG. 1B is a view, similar to FIG. 1A, which illustrates the prior art solid laminated chipboard construction currently used for breadboard panels, made of paperboard products.

DESCRIPTION OF THE PREFERRED EMBODIMENT

Figure 2:
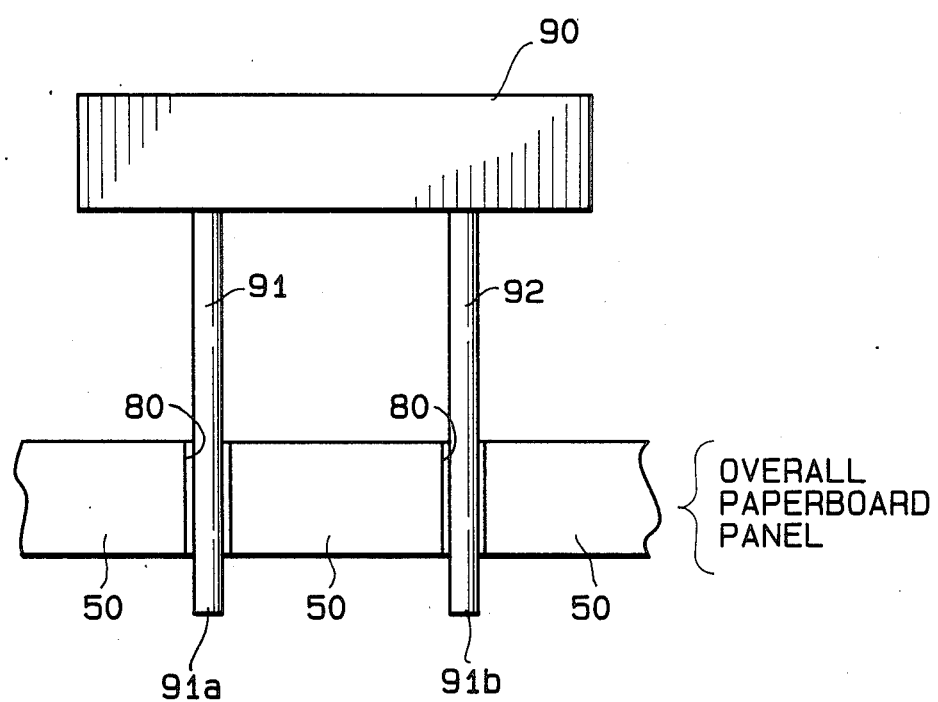
FIG. 2 is a schematic view illustrating the combination of an electronic circuitry component with the breadboard of the present invention.

As shown in FIG. 1A, the breadboard panel construction of the present invention comprises an overlayer 51 of chipboard having relatively shorter fiber lengths 60 contained therein. Underlayer 52 also comprises chipboard material with corresponding shorter fiber lengths 60.

FIG. 1A further illustrates an undulated midstratum layer 53 wherein the upper undulation portions are bonded by adhesive 58 to overlayer 51. Similarly, the lower undulation portions are bonded by adhesive shown at 59.

In the preferred embodiment of FIG. 1A, the undulated midstratum layer 53 is further shown as being comprised of a paperboard material having relatively longer fiber lengths 70 as compared to the shorter fiber lengths 60 shown in the overlayer 51 and the underlayer 52.

By reason of the construction of FIG. 1A, it is seen that air cells or spaces 55 are formed internally of the breadboard panel structure thus reducing the materials cost in the overall manufacture of the present design. In effect, air spaces are used in place of the chipboard product. It is also apparent that the amount of adhesives 58, 59 required by the inventor's design is greatly reduced as compared to the adhesive requirements shown at 35 of prior art FIG. 1B.

While very significantly reducing manufacturing costs, the inventor herein has also discovered that a superior end product is produced. The longer fiber length 70 materials used in the undulating midstratum layer result in a greater original position memory for the overall structure—i.e. it tends to spring back to its original desired flat position if bent as contrasted to the low memory solid chipboard (FIG. 1B) which tends to crack if bent from its desired flat position.

The undulated shape of the midstratum layer also produces a spring-like effect for the overall breadboard panel 50 so that it is more resilient when subject to bending or other potentially destructive usages.

The present breadboard design is of course intended for use in combination with various electronic circuitry components indicated generally at numeral 90 of FIG. 2. As is known in the art, each circuit component 90 has at least two support legs 91 and 92 depending therefrom and extending through the thickness of breadboard 50 so that the ends 91a and 91b may be appropriately soldered to other circuit components. Breadboard 50 has plural apertures 80 formed therein and sized for the snug receipt of the support legs 91 and 92.

By providing a more resilient paperboard breadboard panel 50, the risks of breadboard deformation damage and consequent electronic circuitry malfunction are greatly reduced.

From the foregoing, it will be appreciated by those of skill in the art that the present invention greatly reduces materials costs and product production time. The weight of the end product breadboard panel is significantly reduced thus reducing shipping costs. A thick and durable panel structure is achieved by substituting air spaces and an undulated midstratum layer for the more costly chipboard.

It is further highly significant that, relative to the prior art, the caliper or thickness of a breadboard panel may be increased if desired without adding weight to the unit by reason of the air cell structure of the present invention.

As will be appreciated, a 1/10-inch thick panel formed utilizing the principles of the invention herein weighs significantly less than a solid 1/10-inch chipboard panel, thus reducing shipping weight and cost while increasing product durability.

Finally, the product is more resilient and less susceptible to the cracking problems inherent in the prior art solid laminated chipboard designs.

It is contemplated that adhesives cost savings on the order of 75 percent may be realized by use of the present invention. Further, the use of a product having less internal adhesives results in lower product warpage as compared to chipboard panel systems heretofore known in the art.

It is anticipated that the novel breadboard panel construction of the present invention will find widespread use in all systems which currently utilize the solid laminated chipboard design in the electronics assembly field.

In practice of the invention, it is contemplated that the fibers 60 shown in the over and under chipboard layers 51 and 52 would have an average fiber length of 2 mm or less. It is further contemplated that the fibers 70 in the undulating midstratum layer 53 would have an average fiber length of at least 5 mm or more with the possibility of ranging up to 25 mm or more if a higher quality kraft process paper is utilized as the midstratum layer 53.

It is again emphasized that overall product weight and cost are reduced by reason of the air cells 55 which reduce the number of chipboard layers required in a breadboard panel construction. Simultaneously, the durability of the overall breadboard panel 50 is dramatically increased by reason of the undulating midstratum layer 53 and the relatively longer fiber lengths 70 contained therein which, as has been noted, improve the original position memory of the overall panel 50.

While there has been illustrated and described what is at present considered to be a preferred embodiment of the present invention, it will be appreciated that numerous changes and modifications are likely to occur to those skilled in the art, and it is intended herein to cover all those changes and modifications which fall within the true spirit and scope of the present invention.

I claim:

1. A breadboard panel construction (50) in combination with an electrical circuit component (90) having plural legs (91, 92) depending therefrom, said breadboard panel construction (50) having plural aperture means (80) formed therein for receipt of said circuit component legs (91,92), said breadboard panel (50) having an overlayer (51) comprised of chipboard material having relatively shorter fiber lengths (60) contained therein, said breadboard panel having an underlayer (52) comprised of chipboard material having relatively shorter fiber lengths (60) contained therein, said breadboard panel further having an undulating midstratum layer (53) between said overlayer (51) and underlayer (52), wherein upper undulation portions of said midstratum layer (53) are secured to said overlayer (51) by adhesive means (58), and wherein lower undulation portions of said midstratum layer (53) are secured to said underlayer (52) by adhesive means (59), said breadboard panel construction providing means wherein air cells (55) are formed internally thereof such that a given breadboard panel thickness may be maintained while reducing the number of chipboard layers required for construction, wherein said undulating midstratum layer (53) has relatively longer fiber lengths (70) contained therein as compared to the relatively shorter fiber lengths (60) contained in said overlayer (51) and said underlayer (52), wherein the average fiber length (60) of said overlayer (51) and said underlayer (52) is two millimeters of less, wherein the average fiber length (70) of said undulating midstratum layer (53) is five millimeters or more, wherein said air cells (55) are formed between said overlayer (51) and said underlayer (52) by way of said undulating midstratum layer (53) such that the overall weight of a panel (50) is reduced while improving panel strength via the spring-like effect of said midstratum layer and by the relatively longer fiber lengths (70) contained in said midstratum layer.

* * * * *